(12) United States Patent
Hirae

(10) Patent No.: US 7,414,323 B2
(45) Date of Patent: Aug. 19, 2008

(54) TAB TAPE AND METHOD OF MANUFACTURING THE SAME

(75) Inventor: Kouichi Hirae, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 11/345,396

(22) Filed: Feb. 2, 2006

(65) Prior Publication Data

US 2006/0181299 A1    Aug. 17, 2006

(30) Foreign Application Priority Data

Feb. 15, 2005   (JP)   ............... 2005-037009

(51) Int. Cl.
  *H01L 23/48* (2006.01)
  *H01L 29/08* (2006.01)
  *H01L 31/26* (2006.01)

(52) U.S. Cl. .............. 257/786; 257/40; 257/203; 438/15

(58) Field of Classification Search ............ 257/48, 257/203, 207, 208, 690–692, 784, 786, E21.521, 257/E23.07, E23.179; 438/15
See application file for complete search history.

(56) References Cited

U.S. PATENT DOCUMENTS 7,132,841 B1 * 11/2006 Bertin et al. ............... 324/765
2006/0208350 A1 * 9/2006 Poo et al. .................. 257/692

FOREIGN PATENT DOCUMENTS

JP    8-24586    1/1996

\* cited by examiner

*Primary Examiner*—Hung Vu
(74) *Attorney, Agent, or Firm*—Steptoe & Johnson LLP

(57) ABSTRACT

Input test pads of an adjacent pattern area are placed in a vacant area of a layout area of output test pads, optimizing the layout area of test pads for use in inspection of a semiconductor chip. Thus, it is possible to miniaturize a semiconductor package.

10 Claims, 16 Drawing Sheets

Pcx:PcY=TMX : TMY

PAD LENGTH
Pd1 > Pd2 > Pd3 > Pd4
① > ② > ③ > ④

TAB TAPE AND METHOD OF MANUFACTURING THE SAME

FIELD OF THE INVENTION

The present invention relates to a TAB tape used for a tape carrier package for mounting a semiconductor integrated circuit device and used for a semiconductor package such as a chip on film, and relates to a method of manufacturing the TAB tape.

BACKGROUND OF THE INVENTION

In tape automated bonding (TAB), the pads of an IC and the leads of a tape are simultaneously connected with all pins according to tape assembly bonding, thereby achieving quite high connecting efficiency for an IC having multiple pins. A TAB package is called a tape carrier package (TCP) and characterized by a small size, a small thickness, and a light weight. A tape used for TAB is called a tape carrier (film carrier). Further, the sprocket holes of a tape and its associated standards are based on American film standards. The manufacturing process of three-layer tapes started from a 350-μm pitch and 40 pins (calculator) and has become finer year by year. The appearance of a thermal head in 1983 has achieved finer pitch at a high pace. Fine pitch is currently led by LCD drivers.

Referring to FIGS. 15 to 19, a method of manufacturing a conventional film carrier will be described below.

FIG. 15 is a diagram showing a process of forming holes on the conventional tape carrier. FIG. 16 is a diagram showing a process of applying photoresist on the conventional tape carrier. FIG. 17 is a diagram showing a process of forming leads on the conventional tape carrier. FIG. 18 is a diagram showing a packaging process on the conventional tape carrier. FIG. 19 is a diagram showing the conventional tape carrier.

First, in FIG. 15, device holes 3 and sprocket holes 2 are formed by die-cutting a film 1 (polyimide, epoxy containing glass, or the like) acting as a base material. Then, in FIG. 16, copper foil 4 is bonded to the film 1, on which the device holes 3 and the sprocket holes 2 have been formed as shown in FIG. 15, while being pressure welded by heat rollers, and photoresist is applied to both surfaces of the film 1. Then, in FIG. 17, mask exposure, development, and etching are performed to form a wiring pattern on the film 1, so that leads 6 are formed protruding from the device holes 3 of the film 1, the device holes 3 having been formed as shown in FIG. 15. Unnecessary resist is removed and Sn plating and Au plating (primary plating) and solder plating (primary Ni plating) are performed on the surfaces of the leads, so that a film carrier process is completed.

The film carrier has a length of 20 to 60 m and the film carrier process is continuously performed on the long film. At the completion of all the processes, the film is wound on a reel via spacers and sent to the subsequent process. Mainly two kinds of pump forming processes are available which include a method of forming bumps on a chip and a transfer bump method of forming bumps on the side of leads. In a typical bump forming method, barrier metal is formed on the pads of a semiconductor chip and bumps are formed thereon by plating method, which is the most widely used. The packaging process of FIG. 18 includes an inner lead bonding (ILB) process in which the leads 6 and the electrodes of the semiconductor chip 7 are connected via the bumps, resin is then applied thereon, and the semiconductor chip is sealed. Thereafter, electrical characteristics are measured using measuring terminals formed on the tape and finally the tape is cut according to the predetermined dimensions of a product area 8.

The inner lead pitch of the TCP started from a 350-μm pitch and 40 pins (calculator) and has become finer year by year. The appearance of a thermal head has achieved finer pitch at a high pace. Fine pitch is currently led by LCD drivers. In recent years, LCD panels have become larger and LCD drivers have had more output terminals. An LCD driver is divided into an input side for digital data of images, a power supply, a control signal, and so on and an output side for output to a panel. More pins have been provided for output signals and output terminals have been aligned with finer pitch in response to high power in recent years.

FIG. 19 shows a semiconductor package of a TAB tape for the conventional tape carrier package formed as shown in FIG. 18. Reference numeral 60 denotes input terminal wires and reference numerals 61, 62, 63, and 64 denote leads acting as output terminal wires. Further, the terminal wires are connected to input test pads 60Tp and output test pads 61Tp, 62Tp, 63Tp, and 64Tp for inspecting the electrical characteristics of products. An electrical inspection is conducted by bringing probes into contact with the test pads. In the case of wires connected from the input/output terminals with finer pitch, the test pads are larger than the wires and thus the test pads cannot be aligned in a single line. In order to avoid this problem, the output test pads 61Tp, 62Tp, 63Tp, and 64Tp are aligned in several lines to secure a test pad area. In this way, fine pitch causes a large test pad area on the TCP, increasing the cost of the package.

One solution is disclosed in Japanese Patent Laid-Open No. 8-24586. As shown in FIG. 20 of a conventional tape carrier with a reduced terminal area, since the number of test pads is smaller on the input side of a TCP package, input test pads 67 on a tape are moved to the upper side or lower side with the minimum pitch, and the input terminals of two semiconductor chips 65 and 66 are placed to face each other, so that a layout area can be shared by input test pads 67 and 68 of the two chips on the tape and each TCP can be miniaturized.

DISCLOSURE OF THE INVENTION

In the conventional technique, however, a semiconductor chip has to be rotated by 180° in the ILB process to mount an IC chip on a tape. Further, regarding the bonding accuracy of semiconductor chips and leads, it is necessary to prepare two kinds of location accuracy for standard bonding and bonding with 180-degree rotation. Thus, accurate positioning is necessary and equipment has to be modified. Moreover, two kinds of masks have to prepared in the manufacturing of tape carriers. Further, in a process of inspection, LSI products are rotated by 180° and thus it is necessary to rotate the probe card of test terminals by 180° in each test or measure two chips at the same time. Relative to the increasing number of test terminals for simultaneously measuring two chips, the number of channels of a tester is not sufficient and thus equipment has to be modified.

In order to solve the problems, an object of a TAB tape and a method of manufacturing the same of the present invention is to reduce a test pad area to miniaturize a semiconductor package such as a tape carrier package without changing the orientation of a semiconductor chip.

In order to attain the object, a TAB tape of the present invention comprises a plurality of adjacent pattern areas formed thereon to form a plurality of semiconductor packages therefrom, each of the plurality of adjacent pattern areas comprising a mounting area of a semiconductor chip, an output test pad area including a plurality of output test pads for use in inspection of the semiconductor chip and placed adjacent to the mounting area of a semiconductor chip on one side thereof, and an input test pad area including one or a plurality of input test pads for use in inspection of the semiconductor chip and placed adjacent to the mounting area of a semiconductor chip on the other side thereof, wherein each of the adjacent pattern areas has an overlapping area where the output test pad area and the input test pad area overlap each other, and the output test pads and the input test pads coexist without overlapping each other in the overlapping area in each of the adjacent pattern areas.

The plurality of output test pads form specific rows and columns, and the input test pads are formed on the rows and columns.

A method of manufacturing the TAB tape of the present invention comprises using a mask including a mask pattern, wherein the mask pattern is for forming: a plurality of output test pads for use in inspection of a semiconductor chip; output terminal wires for connecting corresponding output terminals of the semiconductor chip to the output test pads; one or a plurality of input test pads placed in the overlapping area, for use in inspection of a semiconductor chip in the adjacent pattern area; and input terminal wires formed in the adjacent pattern area, for connecting corresponding input terminals of the semiconductor chip to the input test pads.

The mask pattern is such that a mask pattern of the input test pad and a mask pattern of the input terminal wire overlap each other.

Another method of manufacturing the TAB tape of the present invention comprises using a mask including a mask pattern, wherein the mask pattern is for forming: a part comprising a plurality of first output test pads for use in inspection of a semiconductor chip; an output terminal wire for connecting a corresponding output terminal of the semiconductor chip to the part comprising the first output test pad; a part comprising a plurality of second output test pads for use in inspection of a semiconductor chip, the part being in a pattern area adjacent to one side of the semiconductor chip; a part comprising one or more first input test pads for use in inspection of the semiconductor chip, the part being placed in the overlapping area in a pattern area adjacent to the other side of the semiconductor chip; a part comprising one or more second input test pads placed in the overlapping area of the pattern area adjacent to one side of the semiconductor chip; and an input terminal wire for connecting a corresponding input terminal of the semiconductor chip to the part comprising the second input test pad.

Still another method of manufacturing the TAB tape of the present invention comprises using a mask including a mask pattern, wherein the mask pattern is for forming: a half part comprising a plurality of first output test pads for use in inspection of a semiconductor chip; an output terminal wire for connecting a corresponding output terminal of the semiconductor chip to the half part comprising the first output test pad; a half part comprising a plurality of second output test pads for use in inspection of a semiconductor chip, the part being in a pattern area adjacent to one side of the semiconductor chip; a half part comprising one or more first input test pads for use in inspection of the semiconductor chip, the half part being placed in the overlapping area in a pattern area adjacent to the other side of the semiconductor chip; a half part comprising one or more second input test pads placed in the overlapping area of the pattern area adjacent to one side of the semiconductor chip; and an input terminal wire for connecting a corresponding input terminal of the semiconductor chip to the half part comprising the second input test pad.

The first output test pad and the second output test pad are so long as to include an overlapping part even when the mask is caused to displace within a standard range upon combination thereof, and the first input test pad and the second input test pad are so long as to include an overlapping part even when the mask is caused to displace within a standard range upon combination thereof.

The test pad has a rounded mask pattern.

On the TAP tape, the test pad has a length determined by an area of a needle mark of a probe coming into contact with the test pad.

DESCRIPTION OF THE EMBODIMENT

An embodiment of the present invention will be discussed below with reference to specific examples.

Figure 1:
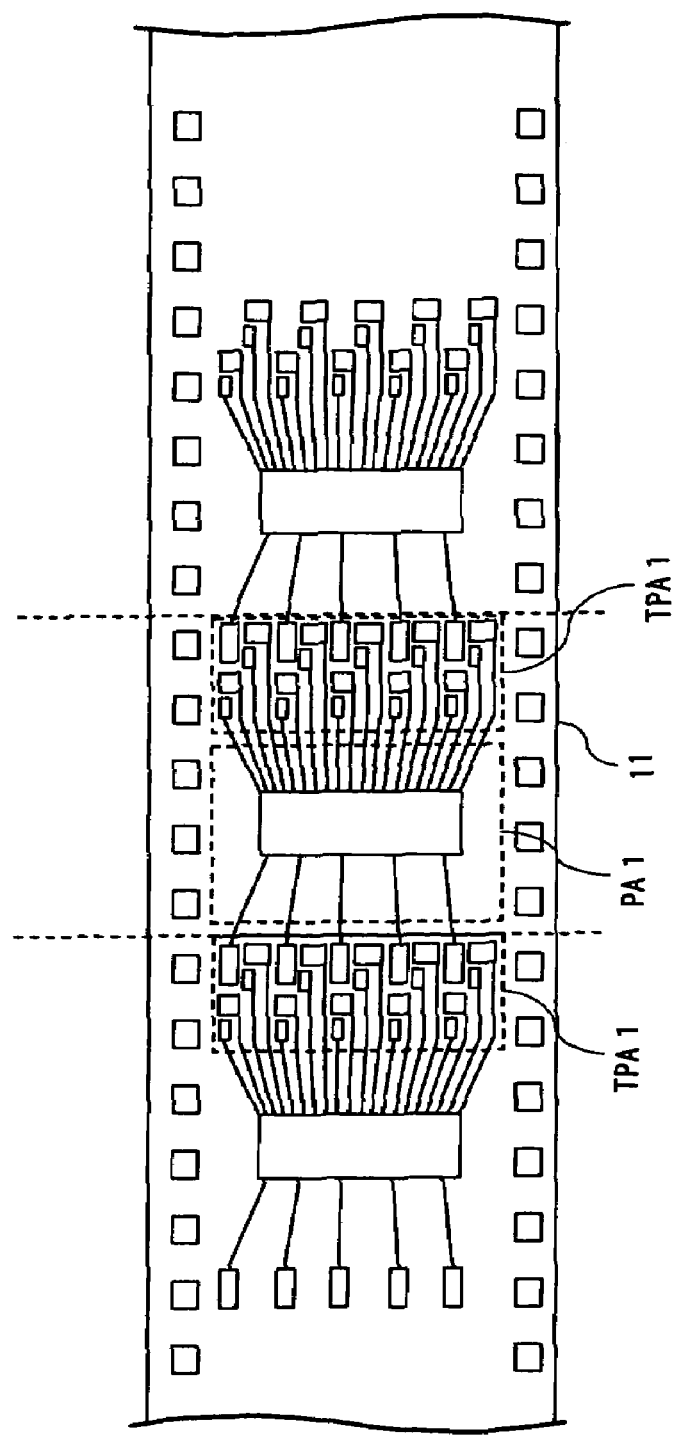
FIG. 1 is a structural diagram showing a TAB tape of the present invention.
Figure 2:
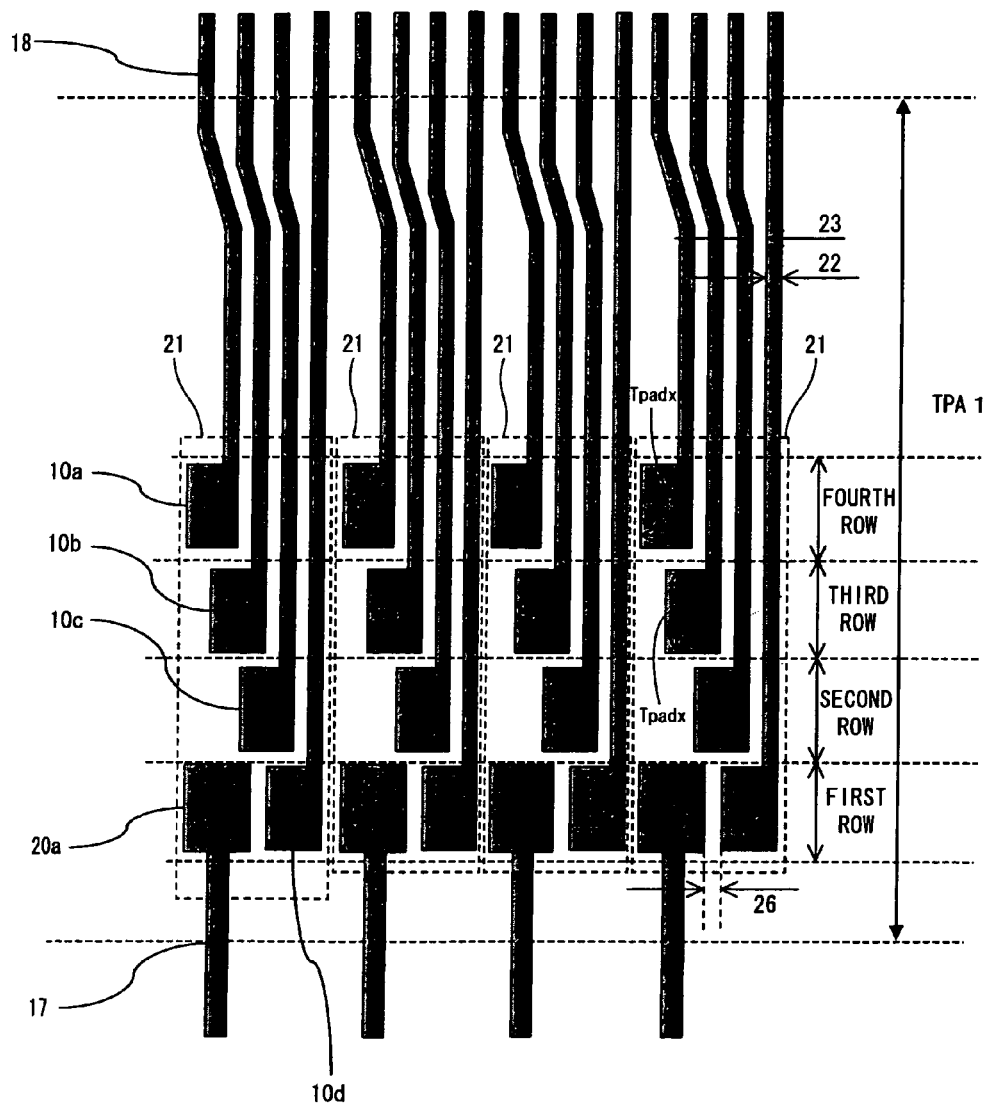
FIG. 2 is an enlarged view of a principle part for explaining a test pad area of the TAB tape of the present invention.
Figure 3:
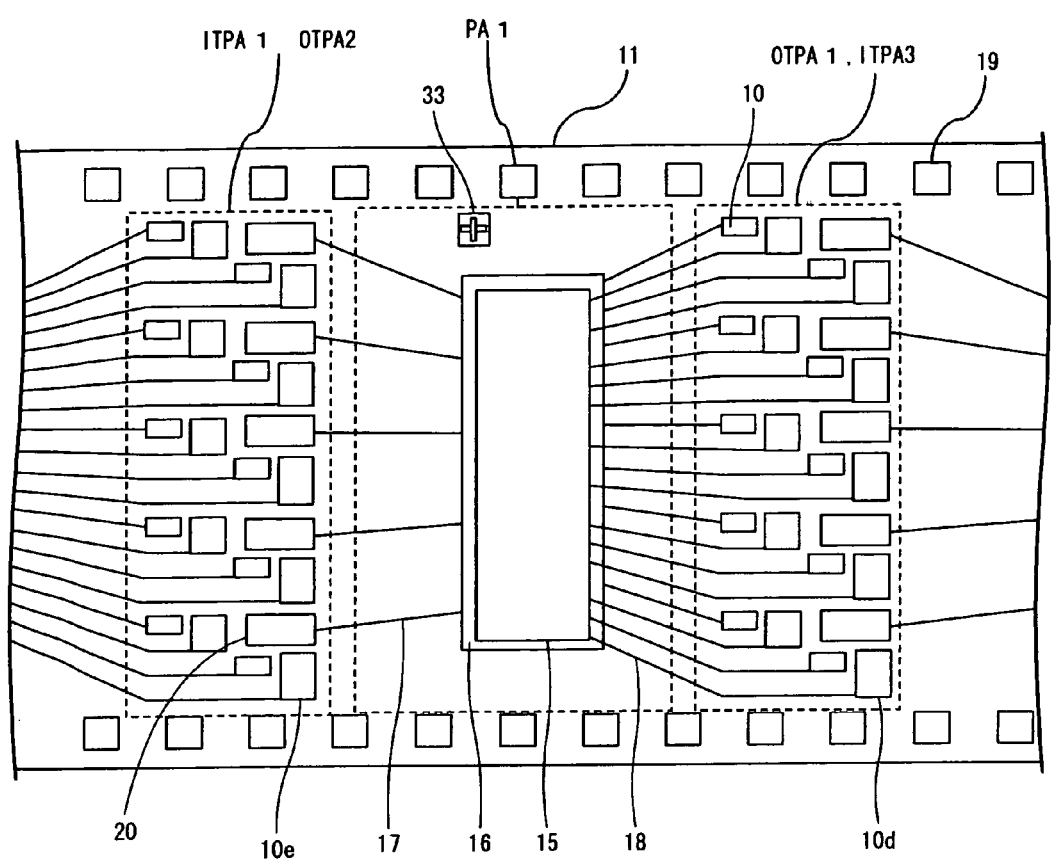
FIG. 3 is a diagram showing a TCP on the TAB tape of the present invention.

Referring to FIGS. 1, 2, and 3, the following will discuss the configuration of a TAP tape according to the present invention.

FIG. 1 is a structural diagram showing the TAP tape of the present invention. FIG. 2 is an enlarged view of a principle part for explaining a test pad area on the TAB tape of the present invention, and an enlarged plan view showing the layout of input/output test pads in an output test pad area TPA1 of FIG. 1. FIG. 3 is a diagram showing a TCP on the TAP tape of the present invention.

In FIGS. 1 and 2, a TAB tape 11 for TCPs of the present invention has a wiring pattern formed by patterning copper foil on a polyimide base film. The TAB tape 11 comprises package areas PA1 where semiconductor packages are formed and input/output test pad areas TPA1 which are formed on both sides of the package area PA1. Pattern areas are sequentially connected, each of which acts as one unit and comprises a package area PA1 and an input/output test pad area TPA1. The input/output test pad area TPA1 is almost equivalent to an area where conventional output test pads are formed. Input test pads are formed in a vacant space after output test pads are formed, so that conventional output test pad areas and input test pad areas are stacked.

The TAB tape 11 is provided as a reel to manufacture a number of TCPs at the same time. As shown in FIG. 3 illustrating only one TCP of the tape 11, the package area PA1 acting as a product includes a chip mounting area 15 where a semiconductor chip is mounted, input terminal wires 17 extending to one side from the chip mounting area 15, and output terminal wires 18 extending to the other side. A window 16 is formed in the chip mounting area 15 through the tape 11 such that a semiconductor chip can be mounted by inner lead bonding (ILB). Input test pads 20 to which the input terminal wires 17 are connected are placed in an input test pad area ITPA1. Output test pads 10 to which the output terminal wires 18 are connected are placed in an output test pad area OTPA1. In this case, the output test pads 10 are formed wider than the output terminal wires 18 such that probes extending from a probe card can be easily connected from the test head of a tester through a board.

Further, sprocket holes 19 are formed at regular intervals along both edges of the tape 11. The sprocket holes 19 are used to correct the position of the package area PA1 and move the TAB tape 11 such that TCPs are sequentially manufactured using the TAB tape 11 for TCPs. The position of the package area PA1 is corrected using a positioning mark 33. Particularly the input test pad area ITPA1, which is the test pad area of TAB of the present invention, is the same area as an output test pad area OTPA2 of the adjacent package. The input test pads 20 and output test pads 10e of the adjacent package are formed on the same column area. The output test pad area OTPA1 is the same area as an input test pad area ITPA3 of the adjacent package on the output side. Output test pads 10d and the input test pads 20 of the adjacent package are formed on the same column area.

Figure 19:
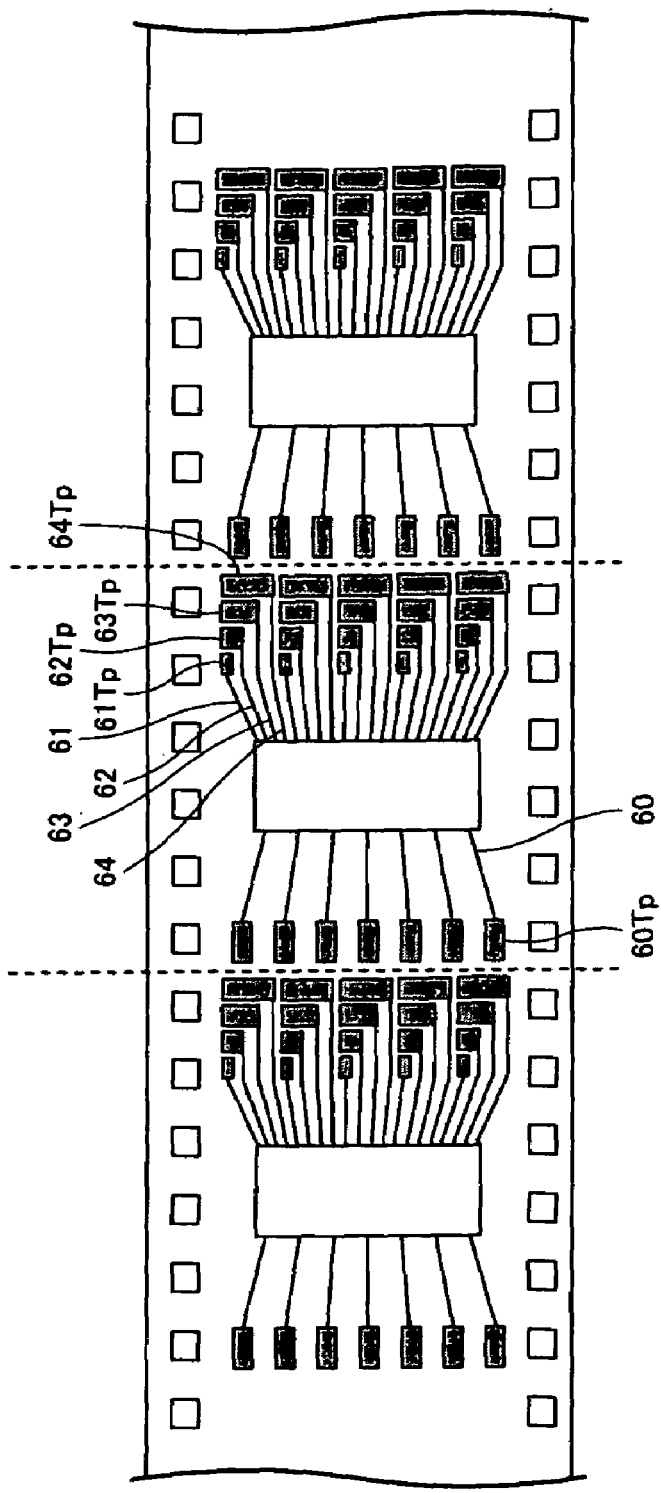
FIG. 19 is a diagram showing the conventional tape carrier.
Figure 20:
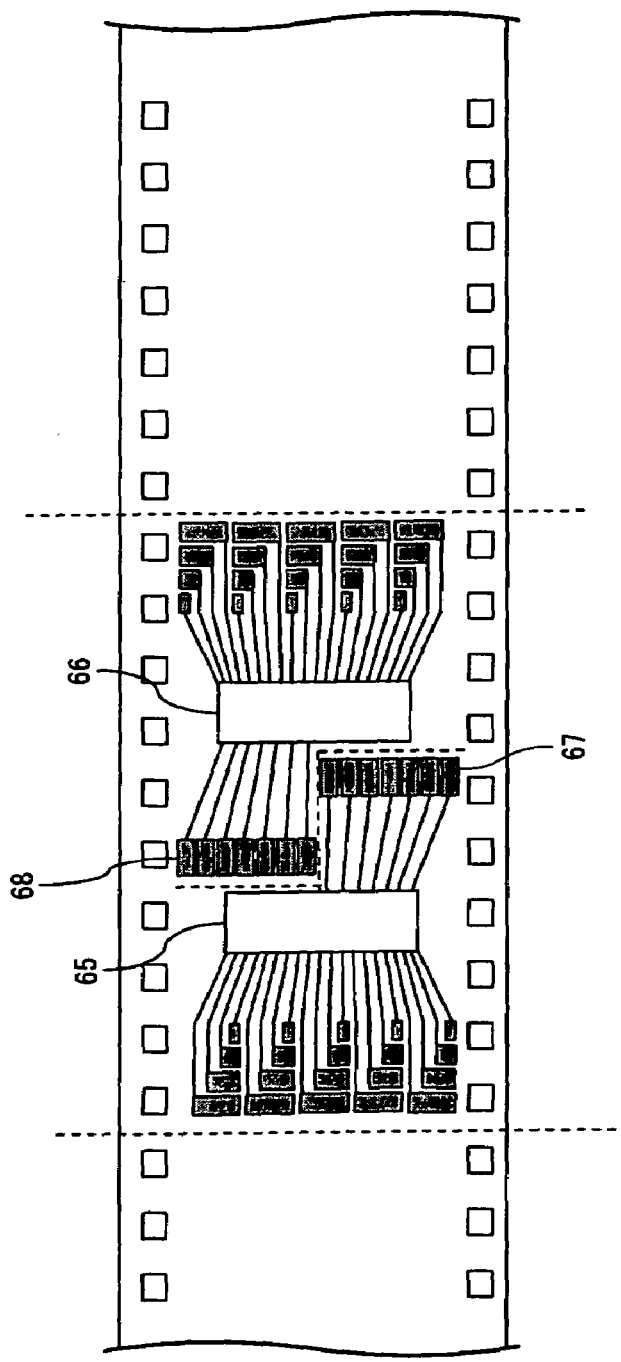
FIG. 20 is a diagram showing a conventional tape carrier with a reduced terminal area.

As shown in FIG. 19, on the conventional TAB tape, input test pads 60Tp and output test pads 61Tp, 62Tp, 63Tp, and 64Tp are placed in different columns. According to the present invention, the input test pad area is included in the output test pad area of the adjacent pattern area, the input/output test pad area can be reduced to a half of the conventional test pad area.

In this way, the input test pad area ITPA3 of the adjacent package is included in the output test pad area OTPA1 and the input test pad area ITPA1 is included in the output test pad area OTPA2 of the other adjacent pattern area, so that the test pad area can be reduced. Referring to FIG. 2, the following will specifically discuss the reason of the reduction.

In FIG. 2, the test pad area TPA1 has the output terminal wires 18 and output test pads 10a, 10b, 10c, and 10d are connected respectively to the output terminal wires 18. Further, the input terminal wires 17 are connected to input test pads 20a. For example, the four output test pads 10a to 10d form one group 21, and the groups 21 are arranged in a sequential manner. The group of the output test pads forms four rows by four columns, in which the test pads are placed in the first column and fourth row (10a), the second column and third row (10b), the third column and second row (10c), and the fourth column and first row (10d). The output terminal wires 18 wired to the output test pads 10a, 10b, 10c, and 10d have to comply with the design rules of the TAB tape. A wire width 22 and a distance 23 between the wires have to be minimized according to standards. The pad size (Tpadx, Tpady) of the test pad is also standardized so as to make electrical contact with test terminals from a tester. The width of the output test pad area in the fourth row of the test pad group 21 requires the wire widths 22 of the three test pads 10b, 10c, and 10d and the four distances 23 in addition to the width Tpadx of the test pad 10a. Similarly, the width of the output test pad area in the third row requires the wire widths 22 of the two test pads 10c and 10d and the three distances 23 in addition to the width Tpadx of the test pad 10b. In the same way, the width of the output test pad area in the second row requires the width Tpadx of the test pad 10c, the wire width 22 connected to the test pad 10d, and the distance 23. Likewise, the output test pad area in the first row requires the test pad width Tpadx of the output test pad 10d and the distance 23. However, the first row of the output test pad only has the output test pad 10d and a sufficient space is left. Thus, the input test pad 20 of the adjacent pattern area can be placed in the first row of the output test pad.

As described above, the input test pad of the adjacent semiconductor package is placed in a vacant space of the layout area of the output test pads, and the package areas PA1 and the input/output test pad areas TPA1 are alternately formed, so that the layout area of the test pads can be reduced almost by an area equivalent to the conventional input test pads. Thus, the test pad area can be reduced to miniaturize a semiconductor package without changing the orientation of a semiconductor chip.

Figure 4:
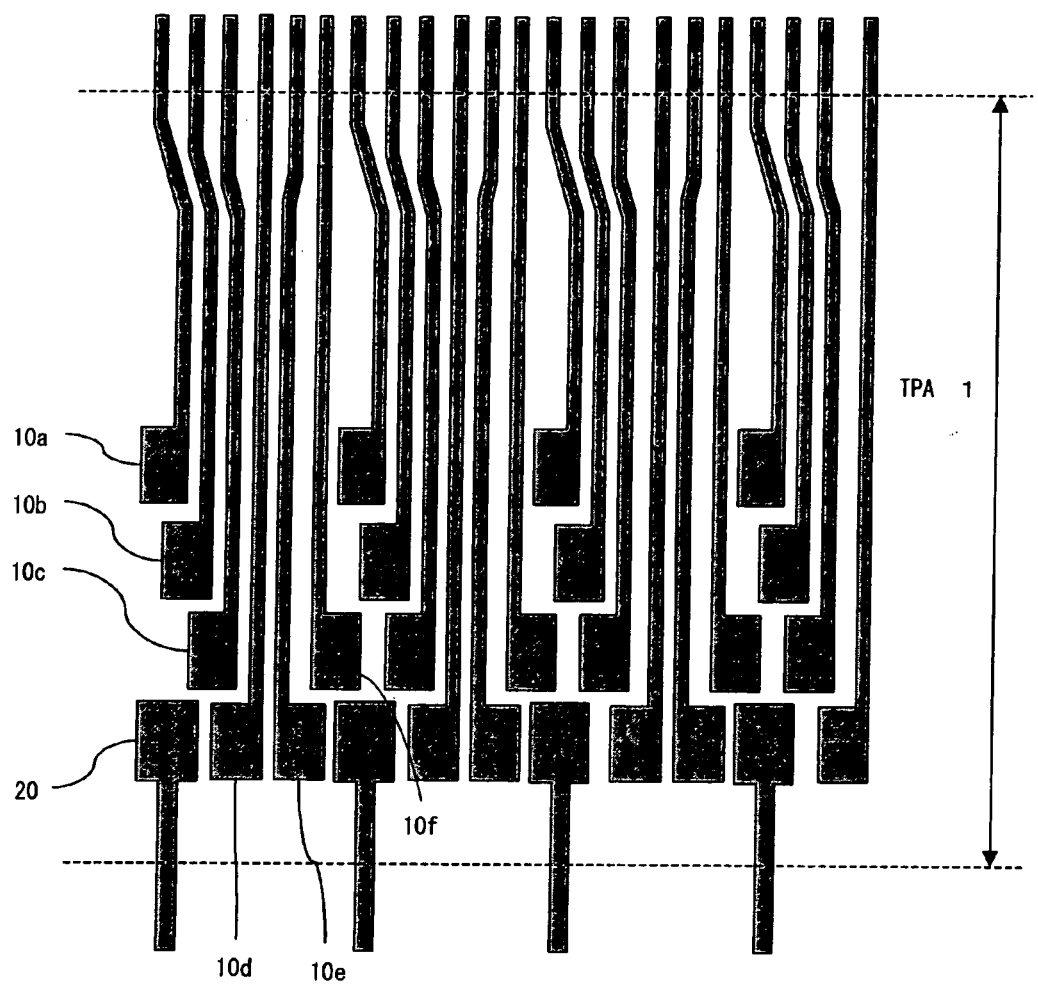
FIG. 4 is an enlarged view of a principle part for explaining a test pad area with four columns and six rows on the TAB tape of the present invention.

FIG. 4 is an enlarged view of a principle part for explaining a test pad area of four columns and six rows on a TAB tape of the present invention. Unlike the TAB tape for TCPs shown in FIG. 2, the input/output test pads are arranged in four columns and six rows.

In FIG. 4, in addition to the output test pads 10a, 10b, 10c, and 10d and the input test pads 20 in four rows and four columns of FIG. 2, an output test pad 10e is placed in the fourth column and fifth row and a test pad 10f is placed in the third column and sixth row. With this layout, the input test pads of an adjacent semiconductor package can be placed in a vacant space of the layout area of the output test pads. Thus, the test pad area can be reduced to miniaturize a semiconductor package without changing the orientation of a semiconductor chip.

Figure 5:
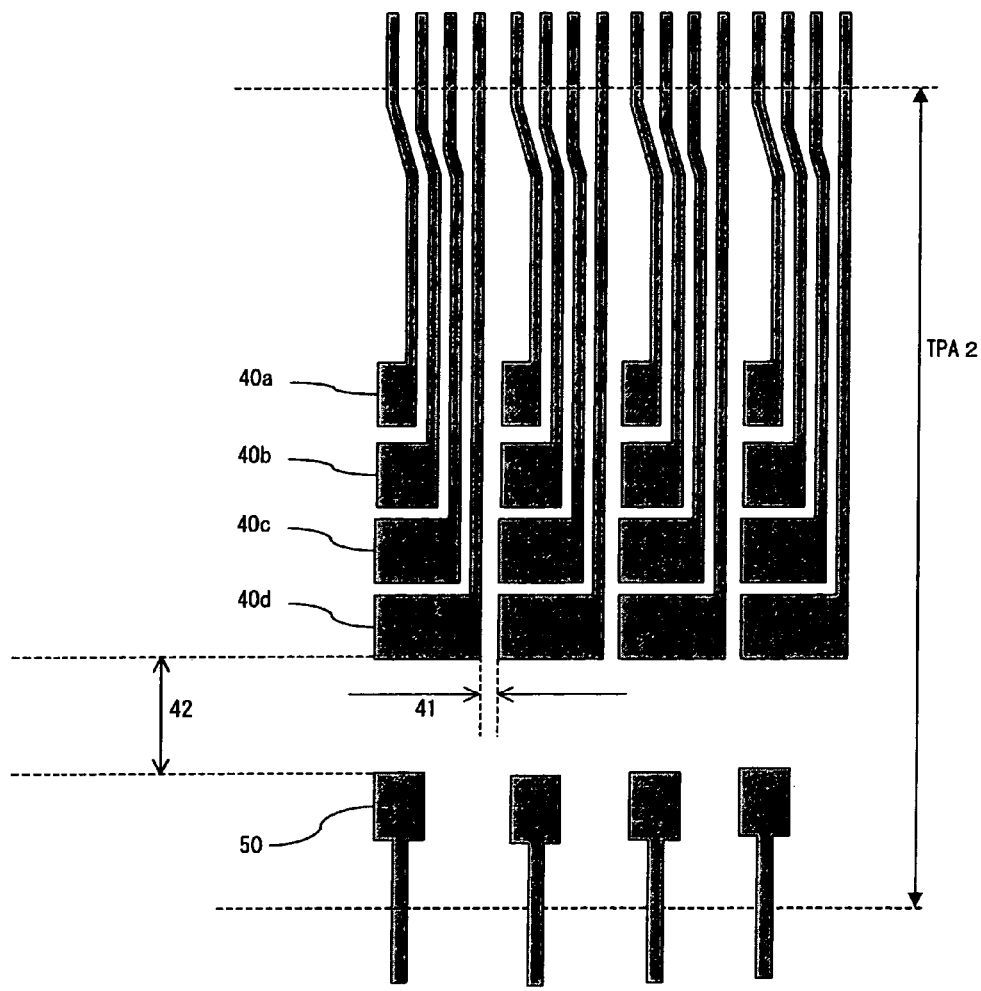
FIG. 5 is an enlarged view of a principle part for explaining a test pad area of a conventional TAB tape.

Referring to FIG. 5, the following will discuss a method of manufacturing the TAB tape according to the present invention.

FIG. 5 is an enlarged view of a principle part for explaining the test pad area of a conventional TAB tape. FIG. 5 shows a test pad area TPA2 of a conventional TAB package for TCPs.

As shown in FIG. 5, the test pad area TPA2 includes output test pads 40a, 40b, 40c, and 40d and input test pads 50 of an adjacent pattern area. In the conventional test pad area, a mask is formed for each tape carrier package and the positioning accuracy of the mask is not necessary. Thus, a distance 42 between the test pads of adjacent pattern areas is a distance between the input test pad 50 and the output test pad 40d. The distance 42 between the test pads is larger than a distance 41 between the test pads in the same pattern area. For this reason, the distance 26 between the pads of adjacent pattern areas have to be set large in FIG. 2.

Figure 6:
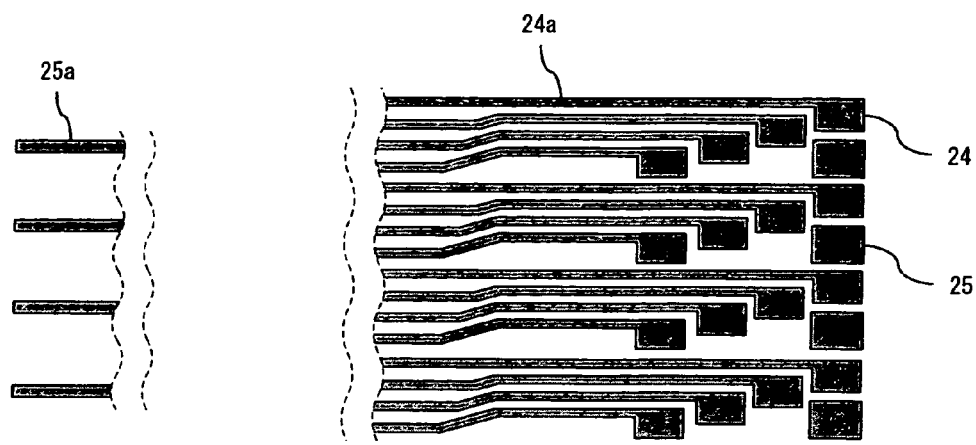
FIG. 6 is a diagram for explaining a mask used for a method of manufacturing the TAB tape of the present invention.
Figure 7:
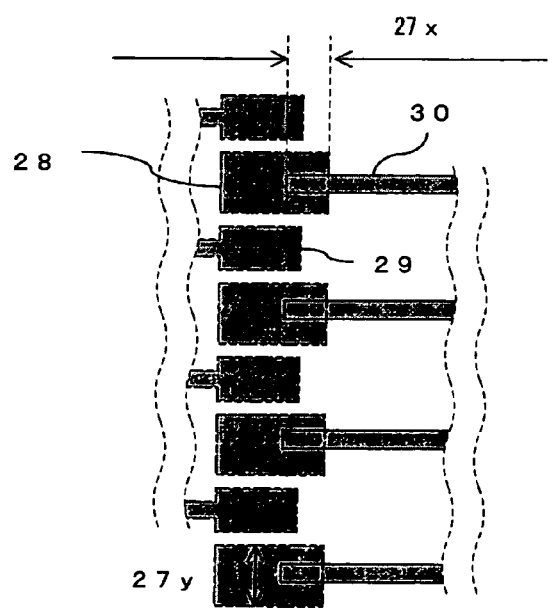
FIG. 7 is a diagram showing input test pads formed by the method of manufacturing the TAB tape of the present invention.

Referring to FIGS. 6 and 7, the following will discuss a method of sharing an adjacent pattern area and test pads while keeping the minimum distance between the test pads.

FIG. 6 is a diagram for explaining a mask for the method of manufacturing the TAB tape of the present invention, showing a part of a wiring mask for obtaining the TAB tape for TCPs shown in FIG. 2. FIG. 7 is a diagram showing input test pads formed by the method of manufacturing the TAB tape of the present invention, showing an overlap of input terminal wires and the input test pads having been exposed using the wiring mask of FIG. 6.

In FIG. 6, the TAB tap wiring mask includes output terminal wiring mask patterns 24a, output test pad mask patterns 24 connected to the output terminal wiring mask patterns 24a, input terminal wiring mask patterns 25a, and input test pad mask patterns 25. The TAB tape has its output terminals and input terminals connected to a semiconductor chip. The output test pads are formed from the output terminals through wires and the input test pads are formed from the input terminals through wires. According to the present invention, the input test pad mask patterns 25 are not connected to the input terminal wiring mask pattern 25a on the mask but are placed between the plurality of output test pad mask 24.

In FIG. 7, on the mask, an input terminal wire 30 and an input test pad 28 are longer in the X direction than a displacement of the adjacent pattern area, and an overlapping length 27x of the input terminal wire 30 and the input test pad 28 is set longer than the displacement in the X direction. In the Y direction, the displacement of the mask is smaller than an input test pad width 27y according to the specifications, and thus a connection is made in the same pad. In a masking process, adjacent TCPs are successively processed, so that the input terminal wires 30 can overlap with the input test pads 28 during the processing of an adjacent TCP and the input terminal wires 30 can be combined with the pads so as to make electrical connection. Since the output test pads and the adjacent input pads are simultaneously exposed, the mask can be formed with the minimum distance between the input test pad 28 and the output test pad 29, achieving a layout with the minimum pitch. As described above, through the exposure of an adjacent TCP, the input test pads 28 and the input terminal wires 30 are separately exposed and then combined with each other, so that the input test pads are formed.

Figure 8:
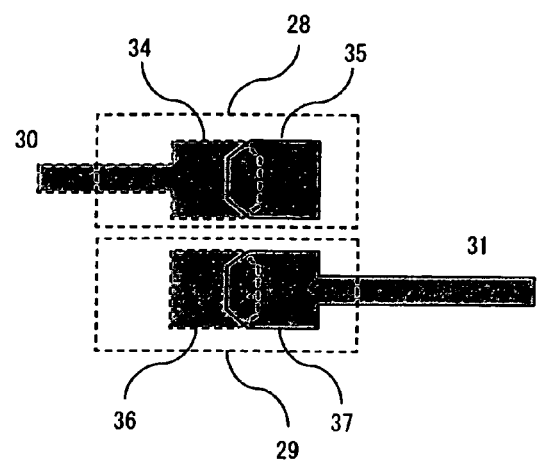
FIG. 8 is a diagram for explaining test pads which are combined and formed according to the method of manufacturing the TAB tape of the present invention.
Figure 9:
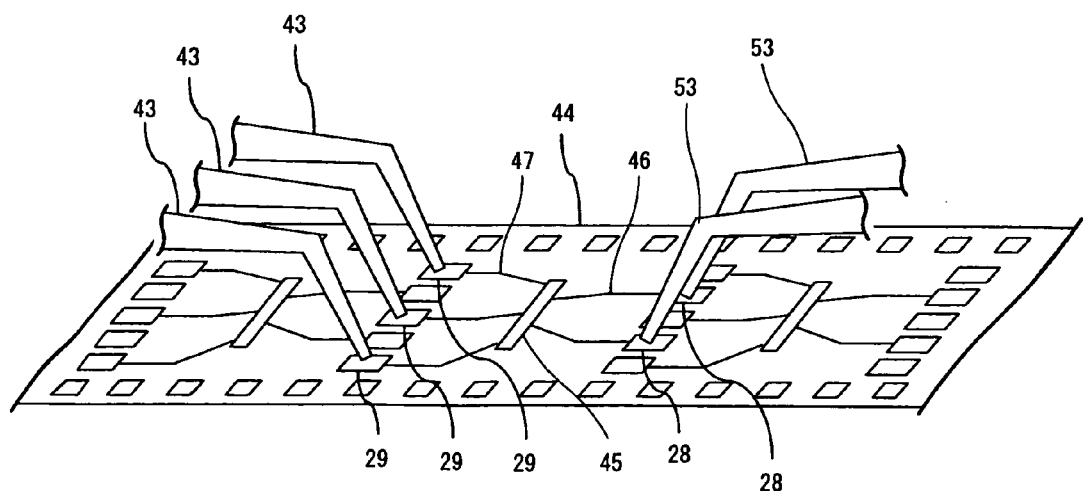
FIG. 9 is a diagram for explaining a configuration to inspect the TAB tape of the present invention.

Referring to FIGS. 8 and 9, the following will discuss a method of manufacturing the TAB tape where test pads are combined and formed during the exposure of an adjacent TCP.

FIG. 8 is a diagram for explaining the test pads which are combined and formed according to the method of manufacturing the TAB tape of the present invention. FIG. 9 is a diagram for explaining a configuration to inspect the TAB tape of the present invention, and a perspective view schematically showing a part of a reel where a TAB tape package 44 for TCPs is inspected with test probes connected to a tester.

In FIG. 8, the input test pad 28 and the output test pad 29 are adjacent to each other in parallel. The mask of the test pads is configured such that, as indicated by solid lines, a part 35 of the input test pad and a part 37 of the output test pad are formed, and a part 34 of the input test pad and a part 36 of the output test pad are similarly formed on the opposite side of the terminal. The input test pad 28 is formed by overlapping the part 35 of the input test pad and the part 34 of the input test pad formed by mask exposure on the adjacent TCP.

The output test pad 29 is similarly formed by overlapping the part 37 of the output test pad and the part 36 of the output test pad formed by mask exposure on the adjacent TCP.

In FIG. 9, input terminal wires 46 and output terminal wires 47 are connected to an LSI 45, which is mounted on the TAB tape, via the terminals of the LSI 45. The input terminal wires 46 are connected to the input test pads 28 and the output terminal wires 47 are connected to the output test pads 29. The test probe includes input terminal probes 53 and output terminal probes 43.

The test probe conducts an inspection by making contact with the test pad of the TAB package for TCPs. The output terminal probes 43 come into electrical contact with the output test pads 29 and the input terminal probes 53 come into electrical contact with the input test pads 28, so that inspections are conducted. In an electrical inspection using the test probe, the probe is pressed to a surface of the tape and caused to slide on the test pad, so that a noxide film acting as an insulator on a surface of the test pad is scrubbed to enable contact through a conducting material. Thus, an inspection can be conducted with low contact and low resistance.

Figure 10:
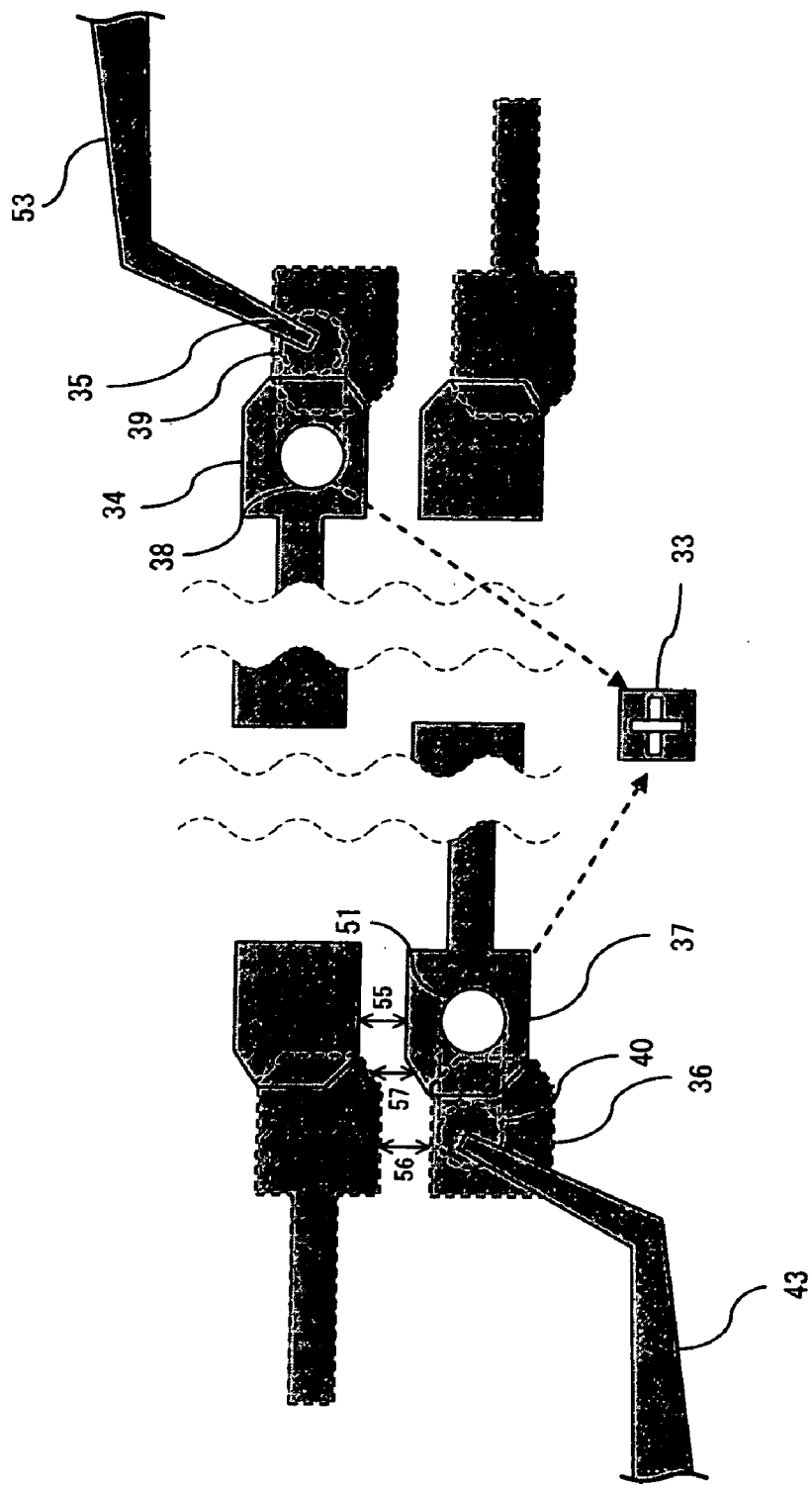
FIG. 10 is a diagram for explaining a method of inspecting the TAB tape of the present invention.

Referring to FIG. 10, the following will discuss a method of inspecting the TAB tape of the present invention.

FIG. 10 is a diagram for explaining the method of inspecting the TAB tape of the present invention. FIG. 10 shows the test pads of the TAB tape for TCPs and the positions of the test probes according to the present invention.

In FIG. 10, the layout of the test pads is the same as FIG. 8. In the TAB package for TCPs of one chip, the input pad includes the parts 34 and 35 of the input test pad and the output test pad includes the parts 36 and 37 of the output test pad. Reference numeral 33 denotes the reference mark for positioning the TAB package for TCPs. The test probes are the input terminal probes 53 and the output terminal probes 43. During an inspection, a load is applied to the probes to make electrical contact between the probes and the test pads and the probes are caused to slide on the test pads, so that the probes move its start positions of contact with the TAB tape for TCPs during an inspection from broken line circles 39 and 40 to solid line circles 38 and 51. In the event of a displacement from the mask of an adjacent pattern area, the test pad of the present invention is configured with a step as shown in FIG. 10, in addition to the configuration of FIG. 8. The part 34 of the input test pad, the part 37 of the output test pad, and the reference position mark 33 belong to the same mask, and thus no displacement occurs when the mask is overlaid. The position of the input terminal of the test probe is corrected by recognizing the reference position mark 33. To be specific, the contact start position 40 of the input terminal probe and the contact start position 39 of the output terminal probe are determined on the test pads by the mask exposure of the adjacent pattern area, so that a displacement occurs. However, during an electrical inspection, the contact position 38 of the input terminal probe and the contact position 51 of the output terminal probe are formed in the same exposure process, enabling contact without being affected by the displaced mask of the adjacent chip.

Figure 11:
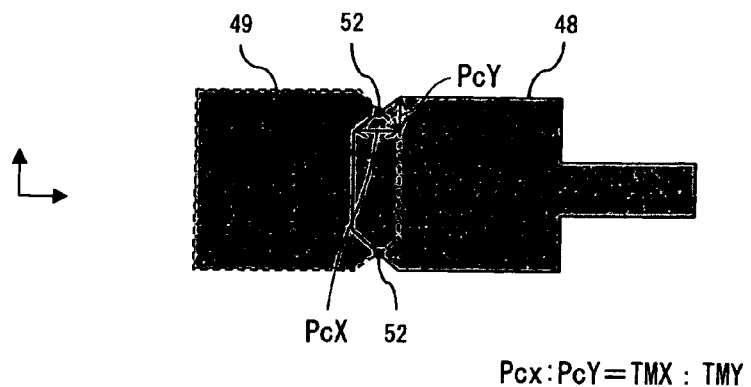
FIG. 11 is a diagram showing the configuration of rounded test pads of the present invention.

It is effective to form the combined test pads with rounded edges. Referring to FIG. 11, the combined test pads will be discussed below.

FIG. 11 is a diagram showing the configuration of the rounded test pads of the present invention. FIG. 11 shows a part of the test pads of FIG. 10.

The test pad of FIG. 11 is divided into two and comprises the test pad 48 of the body and the test pad 49 formed when the adjacent pattern area is masked. The overlapping sides of the two pads form an angle and a corner has a length PCX in the X direction and a length PCY in the Y direction.

When the mask is overlaid, a displacement in the X direction is equal to or smaller than PCX and a displacement in the Y direction is equal to or smaller than PCY relative to an intersection 52 of the two pads according to the specifications. Thus, the pads are connected to each other even in the event of the maximum displacement. As shown in FIG. 11, in the absence of a displacement, the pads generally overlap each other at the midpoint forming an angle. FIG. 10 shows the layout of the pads when the mask exposure between adjacent pattern areas causes the maximum displacement in the X direction and the Y direction. Distances 55 and 56 between the pads are formed in the same mask exposure process, achieving masking with the minimum distance. A distance 57 between the pads is a distance from an adjacent mask. Even in the event of the maximum displacement of the adjacent mask, corners between the pads enable wiring with minimum rules.

Figure 12:
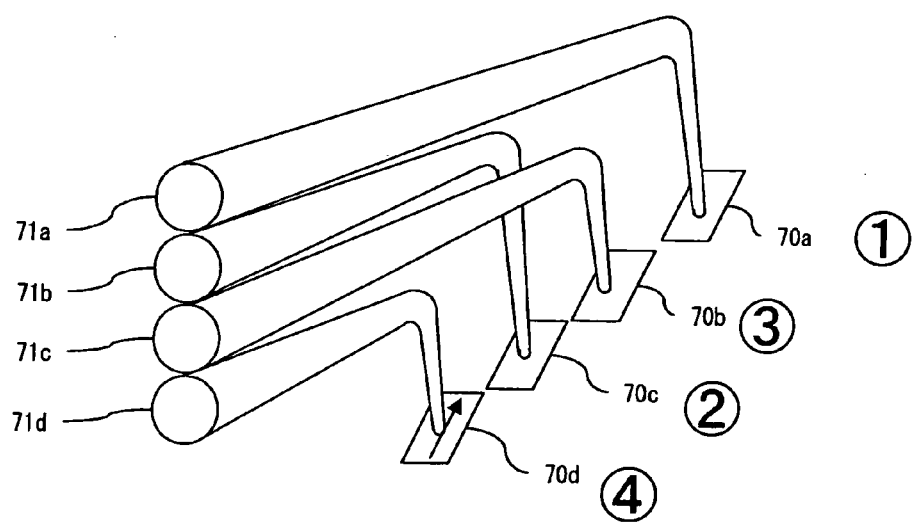
FIG. 12 is a diagram showing the connection between test pads and probes of a probe card.
Figures 13, 14:
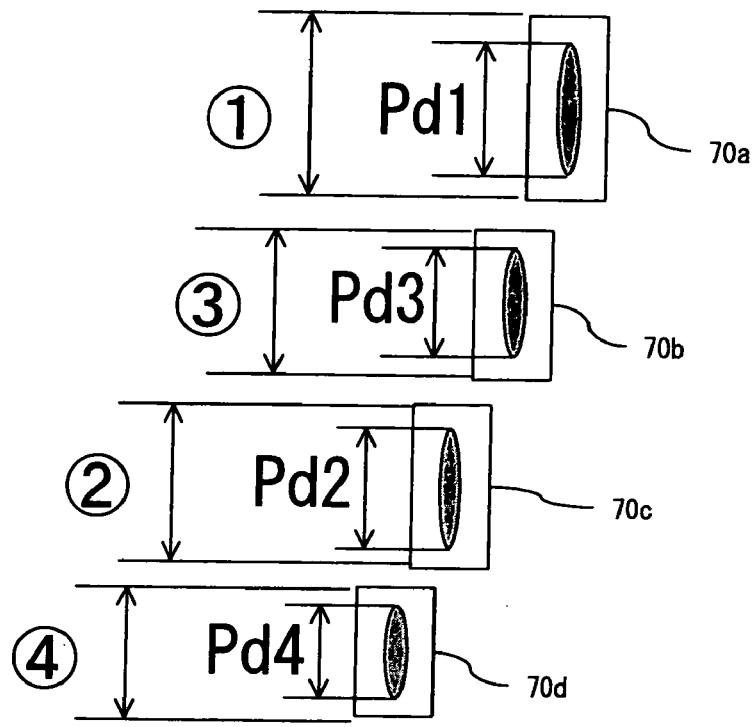
FIG. 13 is a diagram showing needle marks of the probes which come into contact with the test pads.
FIG. 14 is a diagram illustrating the lengths of the needle marks.
Figure 15:
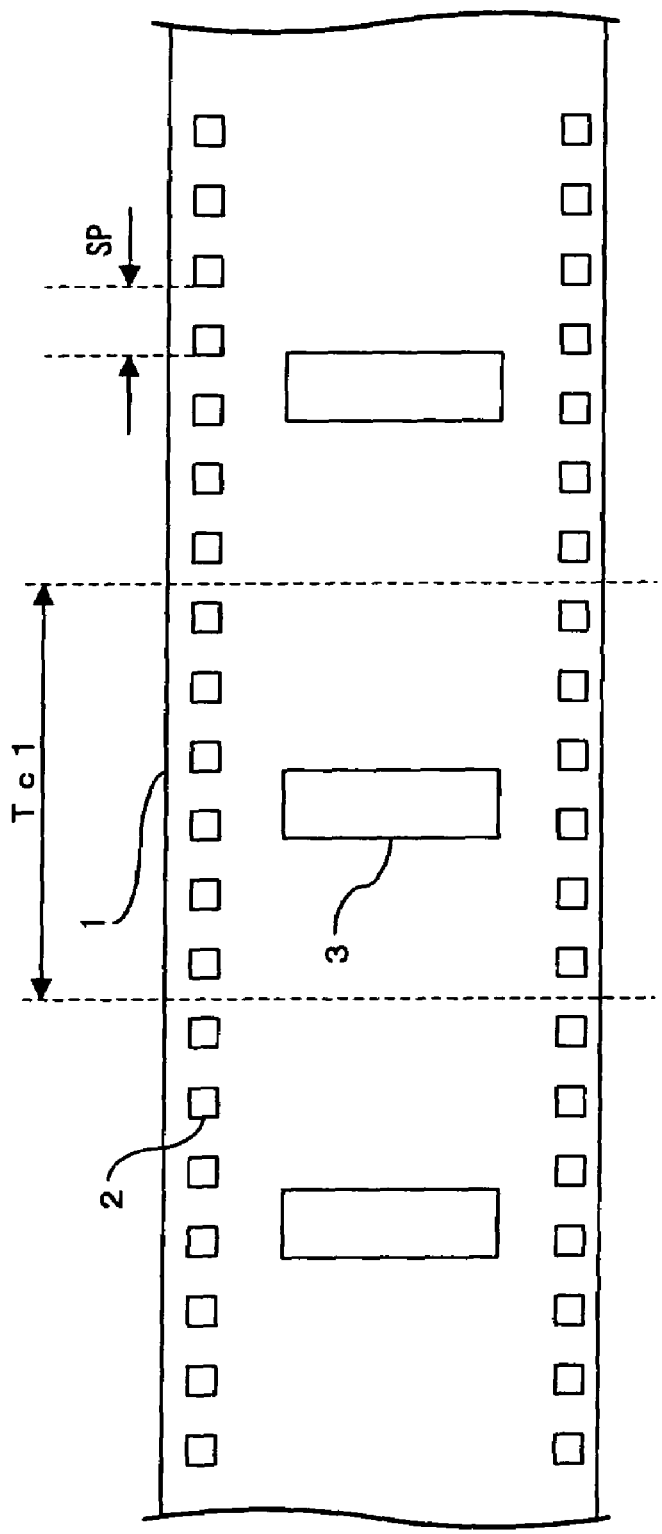
FIG. 15 is a diagram showing a process of forming holes on a conventional tape carrier.
Figure 16:
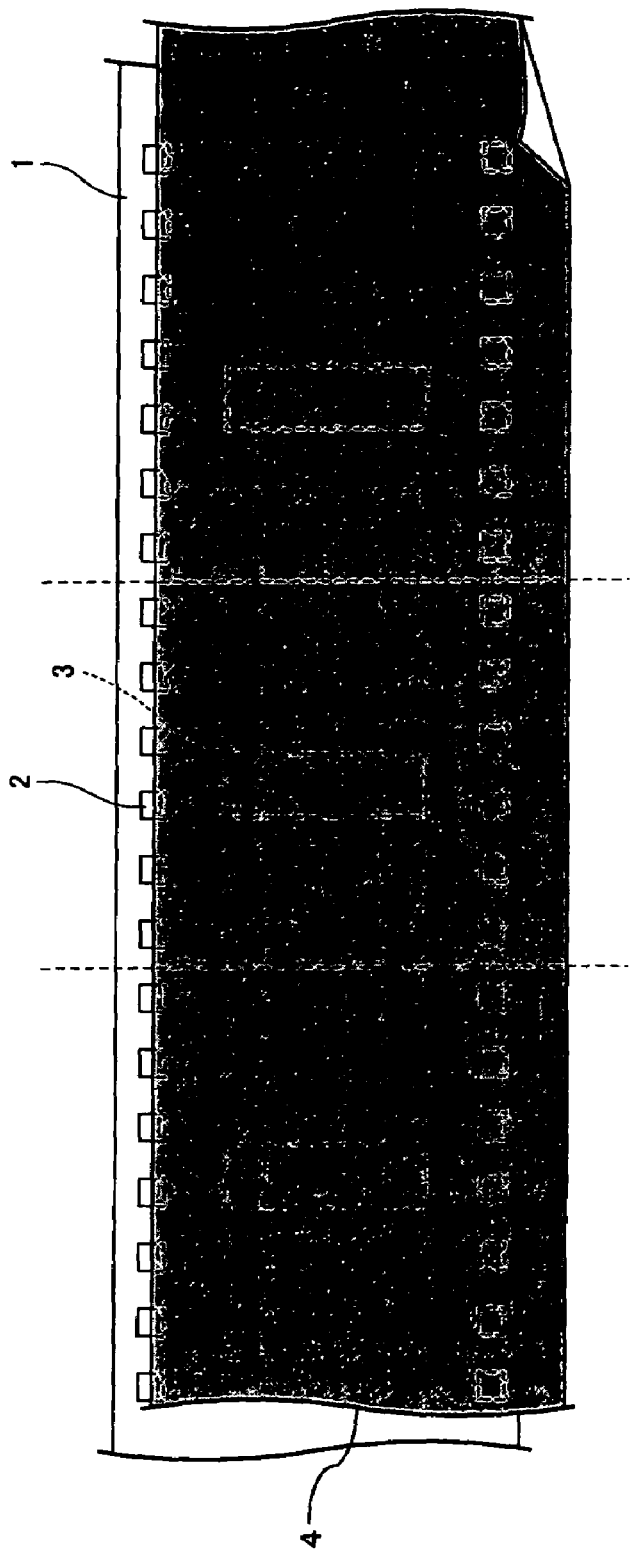
FIG. 16 is a diagram showing a process of applying photoresist on the conventional tape carrier.
Figure 17:
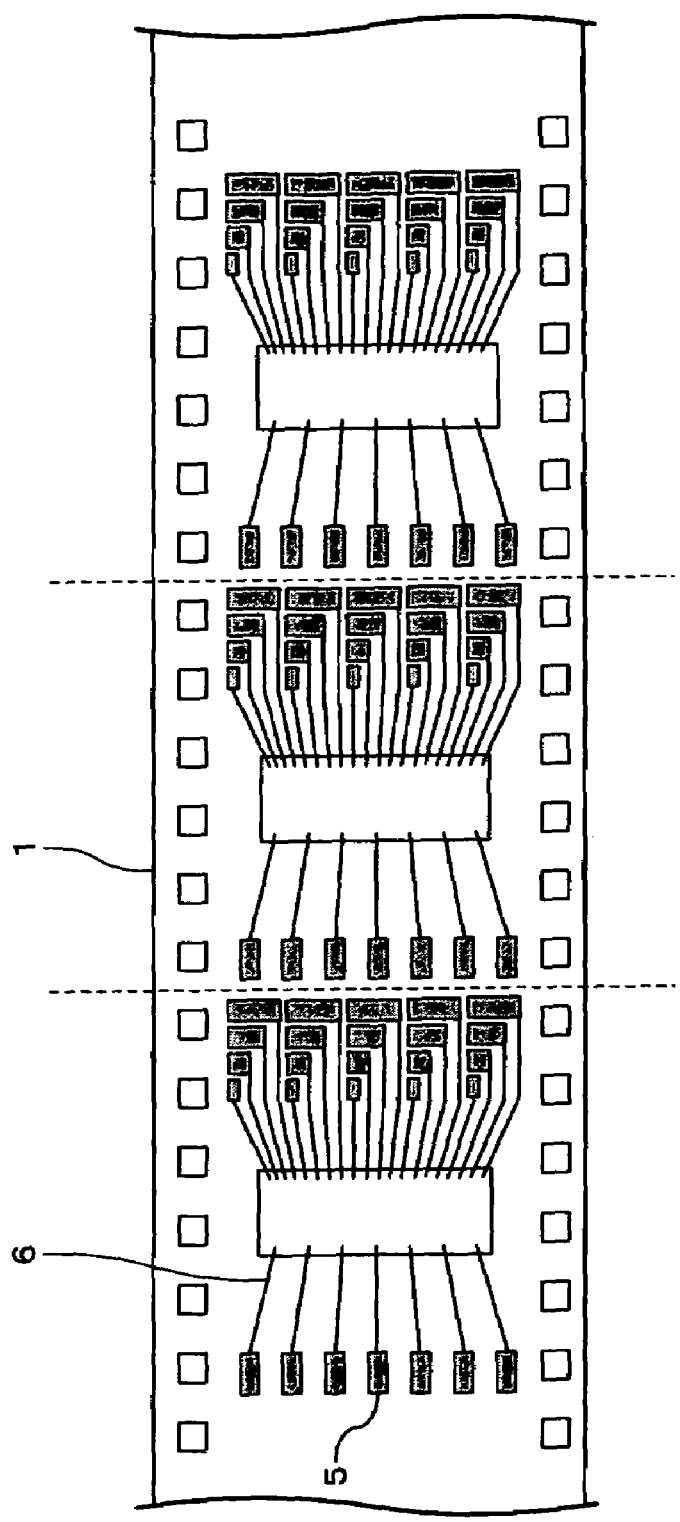
FIG. 17 is a diagram showing a process of forming leads on the conventional tape carrier.
Figure 18:
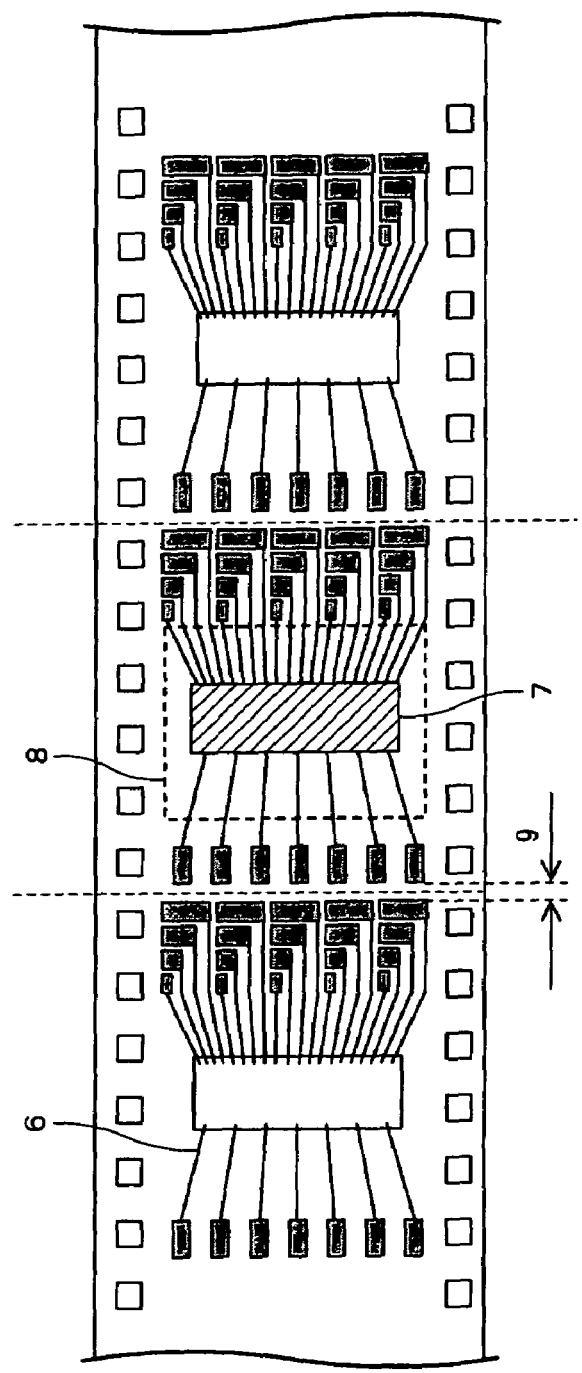
FIG. 18 is a diagram showing a packaging process on the conventional tape carrier.

Referring to FIGS. 12, 13, and 14, the layout of the probes of the tester will be discussed below.

FIG. 12 is a diagram showing the connection between the test pads and the probes of the probe card. FIG. 13 is a diagram showing the needle marks of the probes which come into contact with the test pads. FIG. 14 is a diagram showing the lengths of the needle marks.

In FIG. 12, test pads 70a, 70b, 70c, and 70d are sequentially arranged in one group of four rows and four columns. The test pad 70a is placed in the first row and fourth column, the test pad 70b is placed in the second row and third column, the test pad 70c is placed in the third row and the second column, and the test pad 70d is placed in the fourth row and first column. During an electrical inspection, probes 71a, 71b, 71c, and 71d are brought into contact with the corresponding test pads 70a to 70d from the tester. Since the bases of the probes 71a to 71d coming into contact with the test pads 70a to 70d are thicker than the points of the probes, the bases of the probes 71a to 71d are vertically stacked. In this example, the probe 71a is connected to the test pad 70a, the probe 71b is connected to the test pad 70c, the probe 71c is connected to the test pad 70b, and the probe 71d is connected to the test pad 70d. The test pads and the probes are connected in the optimum order so as to prevent contact between the probes when the probes and the test pads are in contact with each other.

FIG. 13 shows the needle marks of the probes when the probes 71a to 71d and the test pads 70a to 70d come into contact with each other. A needle mark Pd1 is formed when the probe 71a comes into contact with the test pad 70a, a needle mark Pd2 is formed when the probe 71b comes into contact with the test pad 70c, a needle mark Pd3 is formed when the probe 71c comes into contact with the test pad 70b, and a needle mark Pd4 is formed when the probe 71d comes into contact with the test pad 70d.

The lengths of the needle marks of the test pads Pd1 to Pd4 correspond to the order of the vertically stacked bases of the needles. The lengths of the needle marks are Pd1>Pd2>Pd3>Pd4 as shown in FIG. 14. The lengths of the test pads are optimized according to the lengths of the needle marks, so that the areas of the test pads can be minimized. In other words, the lengths of the test pads can be optimized according to the order of the vertically stacked probes and the area of the test pad area can be minimized. Thus, the test pad area can be reduced to miniaturize a semiconductor package such as a tape carrier package.

In the above explanation, the tape carrier package (TCP) was described as an example. The present invention is similarly applicable to other semiconductor packages such as a chip on film.

What is claimed is:

1. A TAB tape comprising:
    a plurality of adjacent pattern areas defining a plurality of semiconductor packages, each of said plurality of adjacent pattern areas comprising:
        a mounting area for a semiconductor chip,
        an output test pad area including a plurality of first output test pads for inspecting such semiconductor chip, said output test pad area located adjacent to said mounting area on a first side thereof, and
        an input test pad area including at least one first input test pad for inspecting such semiconductor chip, said first input test pad located adjacent to said mounting area on a second side of the mounting area opposite the first side,
    wherein each of said adjacent pattern areas has an overlapping area where the first output test pad area of a first pattern area overlaps a first input test pad area of a second pattern area, and the first output test pads of the first pattern area and the first input test pads of the second pattern area are adjacent to each other without overlapping.

2. The TAB tape according to claim 1, wherein the plurality of first output test pads of the first pattern area form rows and columns, and the first input test pads of the second pattern area are located in the rows and columns.

3. A method of manufacturing the TAB tape according to claim 1, said method comprising using a mask including a mask pattern, wherein said mask pattern is for forming:
    said plurality of first output test pads for use in inspection of a semiconductor chip;
    output terminal wires for connecting corresponding output terminals of the semiconductor chip to the output test pads;
    said at least one input test pad in the overlapping area, for use in inspection of a semiconductor chip in the adjacent pattern area; and
    input terminal wires in said adjacent pattern area, for connecting corresponding input terminals of the semiconductor chip to the input test pads.

4. The method of manufacturing the TAB tape according to claim 3, wherein the mask pattern includes a mask pattern of the input test pad and a mask pattern of the input terminal wire overlapping each other.

5. A method of manufacturing the TAB tape according to claim 1, said method comprising using a mask including a mask pattern, wherein said mask pattern is for forming:
    a first part comprising said plurality of first output test pads for use in inspection of a semiconductor chip,
    an output terminal wire for connecting a corresponding output terminal of the semiconductor chip to the part comprising the plurality of first output test pads,
    a second part comprising a plurality of second output test pads for use in inspection of a semiconductor chip, the part being in a pattern area adjacent to a first side of the semiconductor chip,
    a third part comprising said at least one first input test pad for use in inspection of the semiconductor chip, the part being placed in the overlapping area in a pattern area adjacent to the other side of the semiconductor chip,
    a fourth part comprising said at least one second input test pad located in the overlapping area of the pattern area adjacent to the first side of the semiconductor chip, and an input terminal wire for connecting a corresponding input terminal of the semiconductor chip to the fourth part comprising the second input test pad.

6. The method of manufacturing the TAB tape according to claim 5, wherein the first output test pad and the second output test pad are of a predetermined size, such that said overlapping area exists when the mask is displaced within a predetermined range, and the first input test pad and the second input test pad are of a predetermined size, such that said overlapping area exists when the mask is displaced within a standard range.

7. The method of manufacturing the TAB tape according to claim 6, wherein the test pad has a rounded mask pattern.

8. A method of manufacturing the TAB tape according to claim 1, said method comprising using a mask including a mask pattern, wherein said mask pattern is for forming:
- a first half part comprising said plurality of first output test pads for use in inspection of a semiconductor chip,
- an output terminal wire for connecting a corresponding output terminal of the semiconductor chip to the half part comprising the plurality of first output test pads,
- a second half part comprising a plurality of second output test pads for use in inspection of a semiconductor chip, the second part being in a pattern area adjacent to a first side of such semiconductor chip,
- a third half part comprising said at least one first input test pad for use in inspection of such semiconductor chip, the third half part located in the overlapping area in a pattern area adjacent to a second side of such semiconductor chip opposite the first side,
- a fourth half part comprising at least one second input test pad located in the overlapping area of the pattern area adjacent to the first side of such semiconductor chip, and
- an input terminal wire for connecting a corresponding input terminal of such semiconductor chip to the fourth half part comprising the second input test pad.

9. The TAB tape according to claim 1, wherein each test pad has a length determined by an area of a needle mark of a probe with which is in contact with the test pad.

10. A TAB tape comprising:
- a plurality of adjacent pattern areas defining a plurality of semiconductor packages, each of said plurality of adjacent pattern areas comprising:
  - a mounting area for a semiconductor chip,
  - an output test pad area including a plurality of output test pads for inspecting such semiconductor chip, said output test pad area located adjacent to said mounting area on a first side thereof, and
  - an input test pad area including at least one input test pad for inspecting such semiconductor chip, said input test pad located adjacent to said mounting area on a second side of the mounting area opposite the first side,
- wherein each of said adjacent pattern areas has an overlapping area where the input test pad area of a first pattern area overlaps the output test pad area of an adjacent, second pattern area, and the input test pads of the first pattern area are interspersed among the output test pads of the second pattern area.

* * * * *